US012677484B2

(12) United States Patent
Gramuglia et al.

(10) Patent No.: US 12,677,484 B2
(45) Date of Patent: Jul. 7, 2026

(54) SINGLE-PHOTON AVALANCHE DIODES

(71) Applicant: GlobalFoundries Singapore Pte. Ltd., Singapore (SG)

(72) Inventors: Francesco Gramuglia, Munich (DE); Eng Huat Toh, Singapore (SG); Kiok Boone Elgin Quek, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 492 days.

(21) Appl. No.: 18/300,110

(22) Filed: Apr. 13, 2023

(65) Prior Publication Data

US 2024/0347664 A1 Oct. 17, 2024

(51) Int. Cl.
| | |
|---|---|
| *H10F 30/225* | (2025.01) |
| *H10F 39/10* | (2025.01) |
| *H10F 77/00* | (2025.01) |
| *H10F 77/14* | (2025.01) |

(52) U.S. Cl.
CPC ......... *H10F 30/225* (2025.01); *H10F 39/107* (2025.01); *H10F 77/14* (2025.01); *H10F 77/959* (2025.01)

(58) Field of Classification Search
CPC ...... H10F 30/225; H10F 39/107; H10F 77/14; H10F 77/959; H10F 77/148; H10F 77/241
See application file for complete search history.

(56) References Cited

U.S. PATENT DOCUMENTS

| | | | |
|---|---|---|---|
| 5,923,067 | A | 7/1999 | Voldman |
| 6,268,992 | B1 | 7/2001 | Lee et al. |
| 6,768,619 | B2 | 7/2004 | Ker et al. |
| 6,909,149 | B2 | 6/2005 | Russ et al. |
| 8,399,921 | B2 | 3/2013 | Ding et al. |
| 8,399,927 | B2 | 3/2013 | Ding et al. |
| 8,809,905 | B2 | 8/2014 | Lin et al. |
| 8,815,654 | B2 | 8/2014 | Gauthier, Jr. et al. |
| 9,006,783 | B2 | 4/2015 | Di Sarro et al. |
| 11,316,045 | B2 | 4/2022 | Stamper et al. |

(Continued)

FOREIGN PATENT DOCUMENTS

| | | | | | |
|---|---|---|---|---|---|
| CN | 113299787 | A | * | 8/2021 | ........... H10F 77/147 |
| KR | 101762431 | | | 7/2017 | |

OTHER PUBLICATIONS

Hirose et al., "A 250 m Direct Time-of-Flight Ranging System Based on a Synthesis of Sub-Ranging Images and a Vertical Avalanche Photo-Diodes (VAPD) CMOS Image Sensor", Sensors MDPI, Oct. 27, 2018, 14 pages.

(Continued)

*Primary Examiner* — Sitaramarao S Yechuri

(74) *Attorney, Agent, or Firm* — Francois Pagette; Andrew M. Calderon; Calderon Safran & Wright P.C.

(57) ABSTRACT

The present disclosure relates to semiconductor structures and, more particularly, to single-photon avalanche diodes and methods of manufacture. The structure includes: a first deep trench structure in a semiconductor substrate having a conductive material and a material of a first polarity; a second deep trench structure in the semiconductor substrate surrounding the first deep trench structure, the second deep trench structure having a conductive material and a material of a second polarity; and contacts to both the first deep trench structure and the second deep trench structure.

20 Claims, 3 Drawing Sheets

(56)     References Cited

U.S. PATENT DOCUMENTS

| | | | |
|---|---|---|---|
| 2003/0122210 | A1* | 7/2003 | Cohen ................... H10F 71/121 |
| | | | 257/293 |
| 2003/0213971 | A1 | 11/2003 | Yu |
| 2008/0308837 | A1 | 12/2008 | Gauthier, Jr. et al. |
| 2013/0026604 | A1* | 1/2013 | Hsin ..................... H10F 30/225 |
| | | | 257/603 |
| 2014/0015052 | A1 | 1/2014 | Fenouillet-Beranger et al. |
| 2014/0349464 | A1 | 11/2014 | Yang et al. |
| 2015/0187749 | A1 | 7/2015 | Dai |
| 2016/0013205 | A1 | 1/2016 | Vinet et al. |
| 2019/0198701 | A1* | 6/2019 | Moussy ............. H10F 77/1642 |
| 2021/0159336 | A1 | 5/2021 | Stamper et al. |

OTHER PUBLICATIONS

Forcolin et al., "Development of 3D trenched-electrode pixel sensors with improved timing performance", JINST, Pixel 2018 International Workshop, Dec. 10-14, 2018, 10 pages.

Kumagai et al., "A 189×600 Back-Illuminated Stacked SPAD Direct Time-of-Flight Depth Sensor for Automotive LiDAR Systems", ISSCC 2021, Session 7, Imagers and Range Sensors, 3 pages.

Curras et al., "Study of small-cell 3D silicon pixel detectors for the high luminosity LHC", Elsevier, Nuclear Inst. and Methods in Physics Research, Apr. 11, 2019, 8 pages.

Vaschenko et al., "Multi-port ESD protection using bi-directional SCR structures", IEEE, Conference: Bipolar/BiCMOS Circuits and Technology Meeting, Oct. 2003, Abstract, 3 pages.

Jung et al., "A Design of BJT-based ESD Protection Device combining SCR for High Voltage Power Clamp", Journal of Semiconductor Technology and Science, Jun. 30, 2014, vol. 14, No. 3, 6 pages.

Do et al., "A New Dual-Direction SCR with High Holding Voltage and Low Dynamic resistance for 5V Application", Electron Devices Society, May 13, 2019, vol. 7, 5 pages.

Specification and Drawings filed on Mar. 7, 2023 in U.S. Appl. No. 18/118,323, 27 pages.

Specification and Drawings filed on Dec. 17, 2021 in U.S. Appl. No. 17/554,222, 28 pages.

* cited by examiner

400A

16

14

400B

16

14

SINGLE-PHOTON AVALANCHE DIODES

BACKGROUND

The present disclosure relates to semiconductor structures and, more particularly, to single-photon avalanche diodes and methods of manufacture.

A single-photon avalanche diode (SPAD) is a solid-state photodetector. As with conventional photodiodes, a SPAD is based around a semiconductor p-n junction that can be illuminated with charged particles and with a wide portion of the electromagnetic spectrum from ultraviolet (UV) through the visible wavelengths and into the infrared (IR).

In operation, the SPAD is reverse-biased above its breakdown voltage which allows Geiger-mode operation. In a SPAD, the reverse bias is so high that impact ionization occurs which is able to cause an avalanche current to develop. For example, a photo-generated carrier is accelerated by the electric field in the device to a kinetic energy which overcomes the ionization energy of the bulk semiconductor material, knocking out electrons. A large avalanche of current carriers grows quickly and can be triggered from as few as a single photon-initiated carrier.

A SPAD is capable of detecting single photons providing short duration trigger pulses that can be counted. The SPAD can also be used to obtain the time of arrival of an incident photon due to the high speed that the avalanche builds up and the device's low timing jitter. Also, the SPAD may utilize materials including silicon, germanium and other III-V elements for a large variety of applications that utilize the run-away avalanche process.

SUMMARY

In an aspect of the disclosure, a structure comprises: a first deep trench structure in a semiconductor substrate comprising a conductive material and a material of a first polarity; a second deep trench structure in the semiconductor substrate surrounding the first deep trench structure, the second deep trench structure comprising a conductive material and a material of a second polarity, different than the first polarity; and contacts to both the first deep trench structure and the second deep trench structure.

In an aspect of the disclosure, a structure comprises: a deep trench anode extending into a semiconductor substrate, the deep trench anode comprising a P+ sidewall and a conductive material; a deep trench cathode surrounding the deep trench anode and extending into the semiconductor substrate, the deep trench cathode comprising an N+ sidewall and the conductive material; and a contact provided to both the deep trench anode and the deep trench cathode.

In an aspect of the disclosure, a method comprises: forming a first deep trench structure in a semiconductor substrate comprising a conductive material and a material of a first polarity; forming a second deep trench structure in the semiconductor substrate surrounding the first deep trench structure, the second deep trench structure comprising a conductive material and a material of a second polarity, different than the first polarity; and forming contacts to both the first deep trench structure and the second deep trench structure.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to single-photon avalanche diodes (SPAD) and methods of manufacture. More specifically, the SPADs described herein comprise a radial configuration which utilizes deep contacts for an anode and a cathode. Advantageously, the SPADs exhibit improved sensitivity and timing resolution and reduced optical and electrical crosstalk between neighboring pixels, in addition to reduced noise and pixel size, and improved fill factor. The SPADs also exhibit an enhanced breakdown probability and voltage, e.g., a smaller pixel size provides a lower breakdown, amongst other advantages and features described herein.

In more specific embodiments, the SPAD comprises a radial SPAD sensor comprising a conductive deep trench (e.g., polysilicon/doped sidewalls) of a first polarity entirely surrounded by a conductive deep trench of a second polarity (e.g., polysilicon/doped sidewalls). The first deep trench may be an anode and the second deep trench may be a cathode. By extending both the cathode and anode contacts deep into a semiconductor substrate (e.g., Si), for example, it is possible to induce a radial field on the x-y plane (plane horizontal to the semiconductor substrate surface) of the SPAD. The deep trenches may have a circular, hexagonal or square shape or other polygonal shape. The radial SPAD sensor may have application in front or backside illumination.

The SPAD of the present disclosure can be manufactured in a number of ways using a number of different tools. In general, though, the methodologies and tools are used to form structures with dimensions in the micrometer and nanometer scale. The methodologies, i.e., technologies, employed to manufacture the SPAD of the present disclosure have been adopted from integrated circuit (IC) technology. For example, the structures are built on wafers and are realized in films of material patterned by photolithographic processes on the top of a wafer. In particular, the fabrication of the SPAD uses three basic building blocks: (i) deposition of thin films of material on a substrate, (ii) applying a patterned mask on top of the films by photolithographic imaging, and (iii) etching the films selectively to the mask. In addition, precleaning processes may be used to clean etched surfaces of any contaminants, as is known in the art. Moreover, when necessary, rapid thermal anneal processes may be used to drive-in dopants or material layers as is known in the art.

Figure 1A:
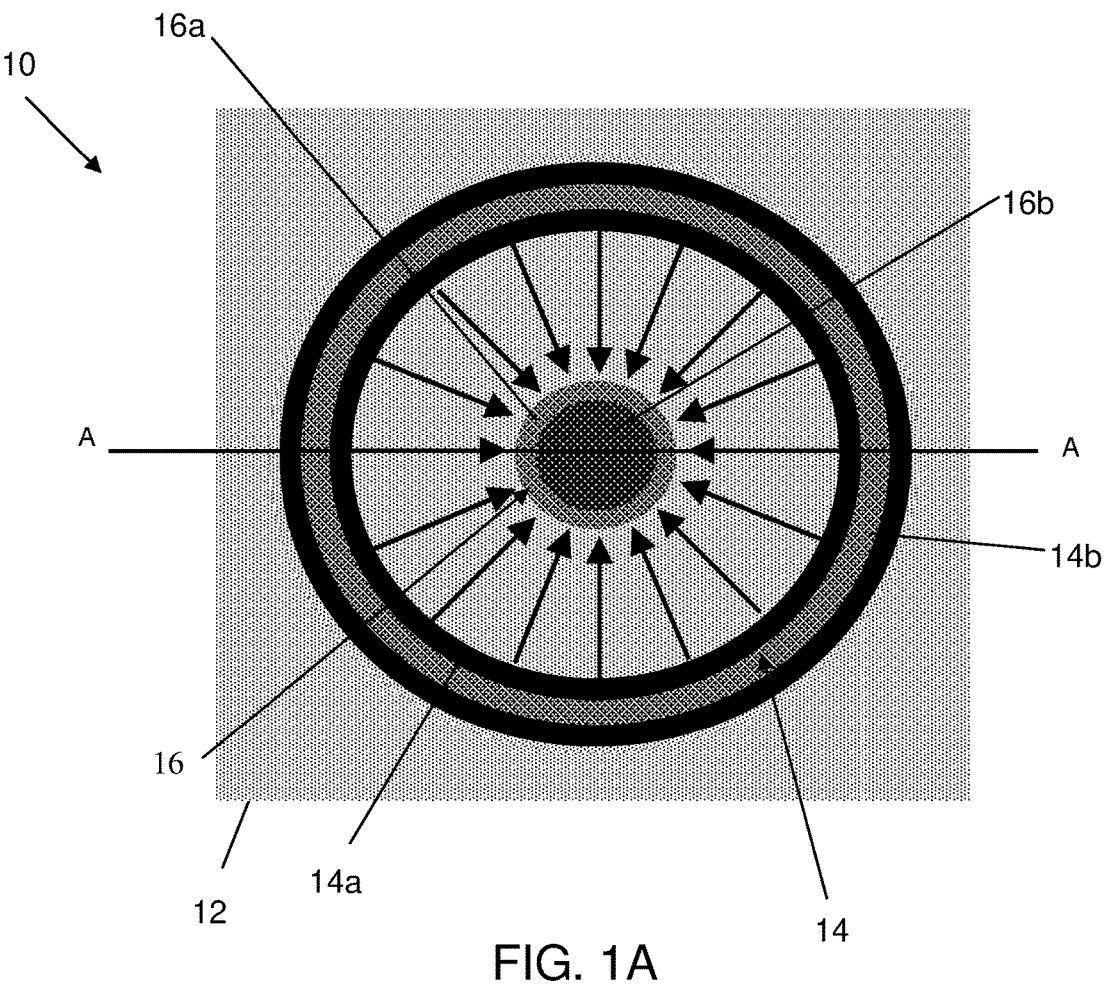
FIG. 1A shows a top view of a single-photon avalanche diode (SPAD) and respective manufacturing processes in accordance with aspects of the present disclosure.
Figure 1B:
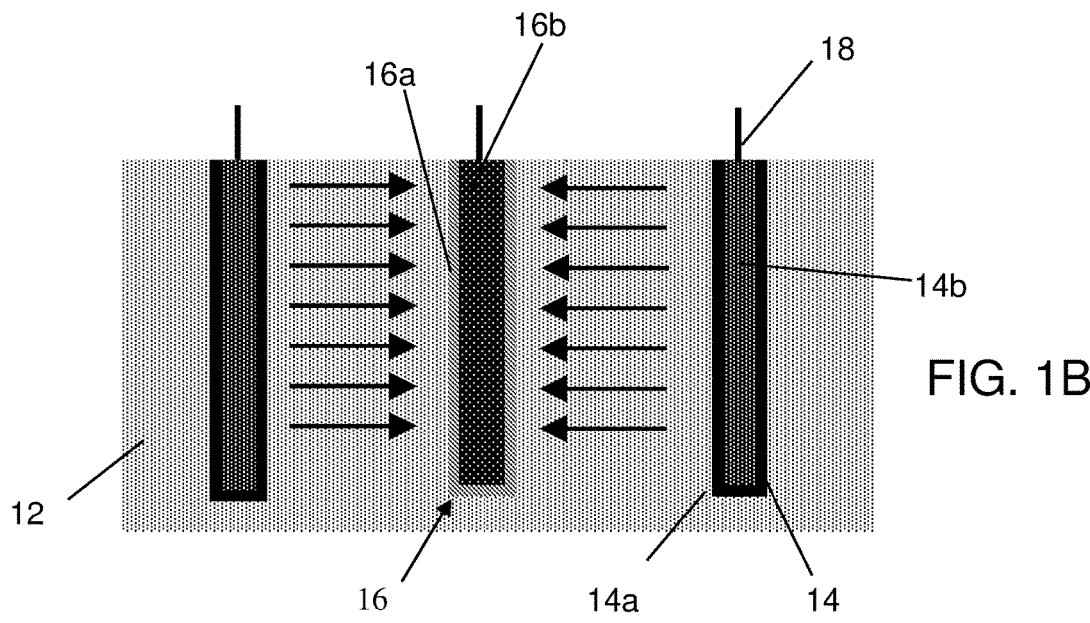
FIG. 1B shows a cross-sectional view of the SPAD of FIG. 1A along line A-A in accordance with aspects of the present disclosure.

FIG. 1A shows a top view of a single-photon avalanche diode (SPAD) and respective manufacturing processes in accordance with aspects of the present disclosure. FIG. 1B shows a cross-sectional view of the SPAD of FIG. 1A along line A-A. Referring to both FIGS. 1A and 1B, the structure 10 includes a semiconductor substrate 12 comprising any suitable semiconductor material. For example, the semiconductor substrate 12 may include, but not limited to, Si, SiGe, SiGeC, SiC, GaAs, InAs, InP, and other III/V or II/VI compound semiconductors. In preferred embodiments, the semiconductor substrate 12 comprises p-type Si material.

Contacts 14, 16 are formed within the semiconductor substrate 12. As should be understood by those of skill in the art, the contacts 14, 16 may be contacts for a cathode 14 and an anode 16, respectively. In an embodiment, the cathode 14 may be n-type and the anode 16 may be p-type. Also, as in each of the embodiments, the cathode and anode and respective dopants/polarity types may be switched (e.g., interchangeably placed). Moreover, although the contacts 14, 16 may be referred to as a cathode and an anode, it should be understood by those of skill in the art that these terms should not be considered limiting features and, instead, are provided for sake of convenience of an implementation of the present disclosure.

In embodiments, the cathode 14 and the anode 16 are deep trench structures of different polarity type, extending deep (but not completely through) into semiconductor substrate 12, e.g., 5 μm to 10 μm or more. In embodiments, the depth of the trenches can vary depending on the desired design characteristics, e.g., photon detection probability. For example, it is possible to widen the photon detection probability with different trench depths, e.g., for optical, visible, ultraviolet and infrared wavelength applications. In further embodiments, the cathode 14 and the anode 16 comprise non-optically transparent conductive material (e.g., conductive material that may have a high resistivity). In embodiments, the non-optically transparent conductive material is metal material including, for example, tungsten. The combination of the non-transparent material and depth of the cathode 14, for example, will mitigate and significantly reduce any crosstalk.

In embodiments, the cathode 14 may be radially positioned about the anode 16. In other words, the cathode 14 may be positioned about the circumference of the anode 16, with the anode 16 being at a central axis. Accordingly, the configuration of the cathode 14 and the anode 16 forms a cylindrical P-i-N SPAD structure (further described below). In embodiments, the diameter of the cylindrical SPAD may be designed based on breakdown voltage characteristics, for example. As should be understood by those of skill in the art, for example, the breakdown voltage will be dependent on the device diameter and, as such, the present disclosure is not limited to any specific diameter; instead, the device diameter will be dependent on design performance characteristics.

From an electrical perspective, the present configuration guarantees a uniformity of the electric field lines in the horizontal plane (compared to a vertical movement in conventional devices) in the active area as designated by the arrows. That is, there will be a high and constant electric field along the radial direction, e.g., with the charges moving horizontally between the cathode 14 to the anode 16 as shown by the arrows in the active region. In addition, the electric field can always be maintained above the critical electric field, e.g., $E_c = 3 \cdot 10^5$ V/cm for Si material (with other materials having other values as is understood by those of skill in the art), along the entire depth of the cathode 14 and the anode 16.

It should be understood that the critical electric field is a value in which impact ionization occurs, which starts the avalanche process. In this way, the avalanche multiplication region is in the entire area between the anode 16 and the cathode 14, with an accompanying sharp timing response, e.g., improved jitter performance. The deep trench for the cathode 14 can also be used to provide a cathode bias. Moreover, in this configuration, the center deep contact, e.g., the anode 16, allows a low resistivity path for the cathode 14 deep in the semiconductor substrate 12.

As should be understood by those of skill in the art, the avalanche multiplication is based on a high electric field on the order of several volts per micrometer within the SPAD that accelerates the carriers. If the electron's energy is high enough, it is able to generate further electron-hole pairs by impact ionization.

In implementation and operation, the breakdown probability may be uniform along the depth of the semiconductor substrate 12, with the wavelength limit being based on the vertical depth of the contacts 14, 16, e.g., contacts for the cathode 14 and the anode 16. For example, there is a uniform breakdown probability, e.g., substantially constant breakdown probability profile, along the depth of the cathode 14 and the anode 16, in addition to a full depletion of photons throughout the depth of the semiconductor substrate 12. That is, as an example, wherever a photon is absorbed in the device volume it will have the same probability to generate an avalanche.

The deep trench structures, e.g., the cathode 14 and the anode 16, also allow improved optical insulation between neighboring pixels. For example, the deep trench structures, e.g., the cathode 14 and the anode 16, will block the path of both primary and secondary photons which improves, e.g., reduces, optical crosstalk with relatively low noise. In addition, the deep trench structures, e.g., cathode 14 and anode 16, widens the photon detection probability (PDP) and Near-Infrared (NIR) sensitivity. Moreover, the breakdown and sensitivity can be tuned by tuning the doping level of the cathode 14 and the anode 16.

The deep trench structures forming the cathode 14 and the anode 16 may be formed by conventional lithography, etching and deposition methods known to those of skill in the art, accompanied with a conventional ion implantation or diffusion process to form respective sidewalls 14a, 16a. For example, a resist formed over the semiconductor substrate 12 is exposed to energy (light) and developed utilizing a conventional resist developer to form a pattern (opening). An etching process with a selective chemistry, e.g., reactive ion etching (RIE), will be used to transfer the pattern from the patterned photoresist to the semiconductor substrate 12 to form one or more trenches in the semiconductor substrate 12. The trenches may undergo a conventional ion implantation or diffusion process to form different polarity types or oppositely doped sidewalls (e.g., N+ sidewall 14a for the cathode 14 and P+ sidewall 16a for the anode 16).

Following the resist removal by a conventional oxygen ashing process or other known stripants, conductive material 14b, 16b may be deposited within the trenches by any conventional deposition processes, e.g., chemical vapor deposition (CVD) processes. Any residual material on the surface of the semiconductor substrate 12 can be removed by conventional chemical mechanical polishing (CMP) processes.

In embodiments, the conductive material 14b, 16b may be non-transparent, low resistivity material. For example, the low resistivity material may be polysilicon or a metal or metal alloy. The metal or metal alloy may include, but is not limited to, tungsten, copper, aluminum, TaN, TiN, etc. In the case of using polysilicon, the low resistivity material 14b for the cathode 14 may be an n-doped polysilicon and the low resistivity material 16b of the anode 16 may be a p-doped polysilicon.

The N+ doped sidewall 14a may be, for example, arsenic or phosphorous doped semiconductor material, doped by an ion implantation process or a diffusion process as is known in the art such that no further explanation is required for a complete understanding of the present disclosure. In further embodiments, the dopant may be antimony. The P+ doped sidewall 16a may be, for example, boron doped semiconductor material. The present configuration also limits the number of implantations required for forming a SPAD, compared to conventional devices.

In embodiments, the doped sidewall 14a will uniformly provide cathode voltage to a level of 10 μm or more within the semiconductor substrate 12; although other depths are contemplated herein depending on the desired photon detection probability. Also, as should be understood by those of skill in the art, the combination of the P+ doped sidewall 16a, semiconductor substrate 12 and the N+ doped sidewall 14a may form a P-i-N SPAD structure.

Still referring to FIGS. 1A and 1B, contacts 18 are provided to the cathode 14 and the anode 16. The contacts 18 may be formed by conventional lithography, etching and deposition processes as described herein. In embodiments, the contacts 18 may be copper, aluminum of other metal or metal alloy as is known in the art. In embodiments, the contacts 18 may be embedded within interlevel dielectric material, lined with a sidewall liner material, e.g., TiN or TaN.

Figure 2:
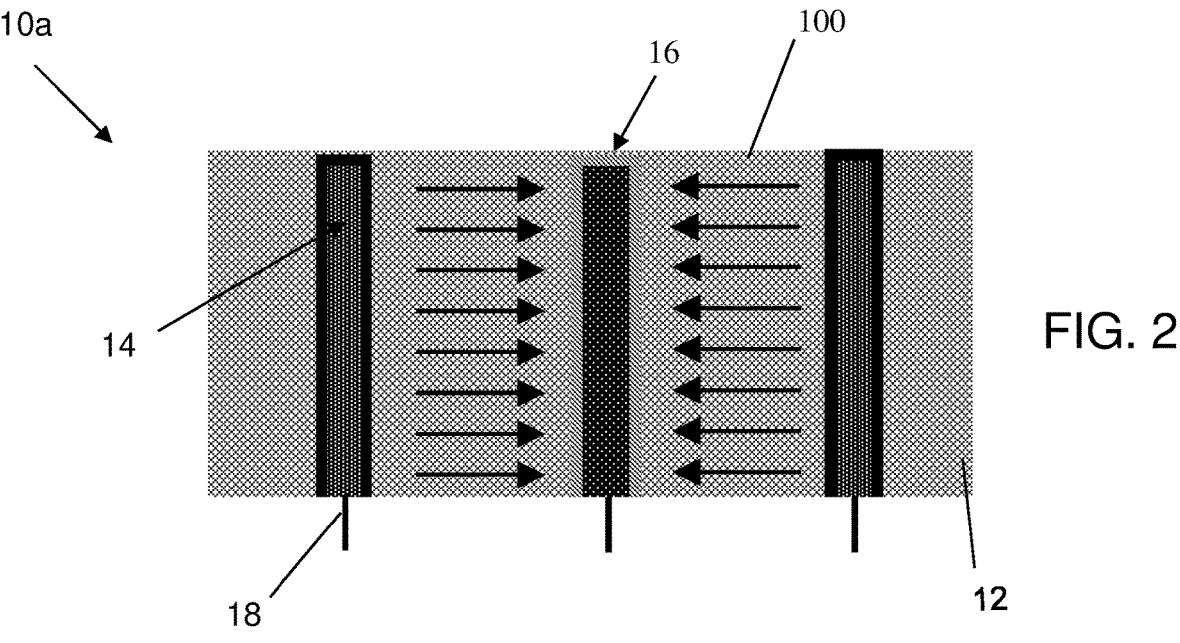
FIG. 2 shows a SPAD in accordance with additional aspects of the present disclosure.

FIG. 2 shows a SPAD in accordance with additional aspects of the present disclosure. In the structure 10a, the cathode 14 and the anode 16 extend through a substantial depth of the semiconductor substrate 12. In this embodiment, the semiconductor substrate 12 is flipped over so the contacts 18 are on a bottom and the bottom of the cathode 14 and anode 16 are at the top of the semiconductor substrate 12.

In more specific embodiments, the device (SPAD) is completely isolated, as the cathode 14 and the anode 16 are provided to the backside surface 100 of the device, e.g., full depth of the semiconductor substrate 12. In embodiments, this configuration may be achieved by a backside grinding and polishing process on a backside 100 of the semiconductor substrate 12 as is known in the art. The remaining features of the structure 10a are similar to the structure 10 shown in FIGS. 1A and 1B.

Figure 3:
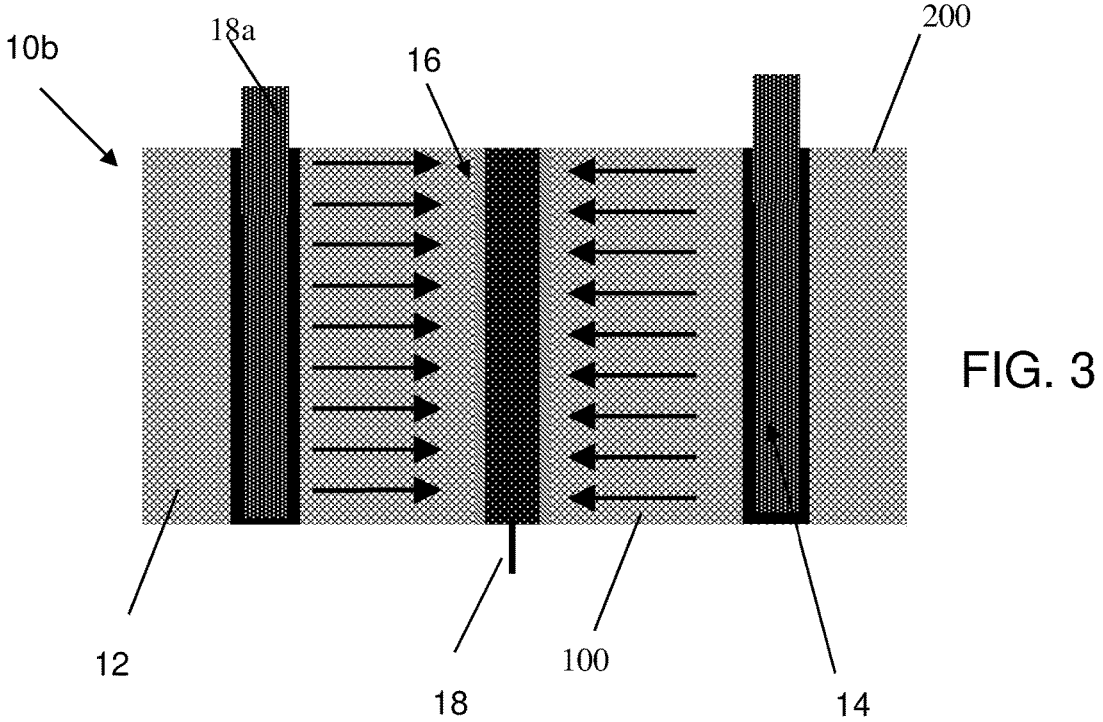
FIG. 3 shows a SPAD in accordance with further aspects of the present disclosure.

FIG. 3 shows a SPAD in accordance with additional aspects of the present disclosure. In the structure 10b, the cathode 14 extends through a substantial depth of the semiconductor substrate 12 to a backside 100; whereas the anode 16 extends entirely though the semiconductor substrate 12. Also, the contacts 18a of the cathode 14 are an extension of the metal, metal alloy or polysilicon material used to form the cathode 14. In embodiments, the extensions, e.g., contacts 18a, are formed from a backside 200 of the semiconductor substrate 12. In embodiments, this configuration may be achieved by forming the anode 16 as described in FIG. 2, e.g., using a backside grind and polishing process of the semiconductor substrate 12, followed by forming of the cathode 14 formed from a backside. The remaining features of the structure 10b are similar to the structure 10a shown in FIG. 2.

Figure 4A:
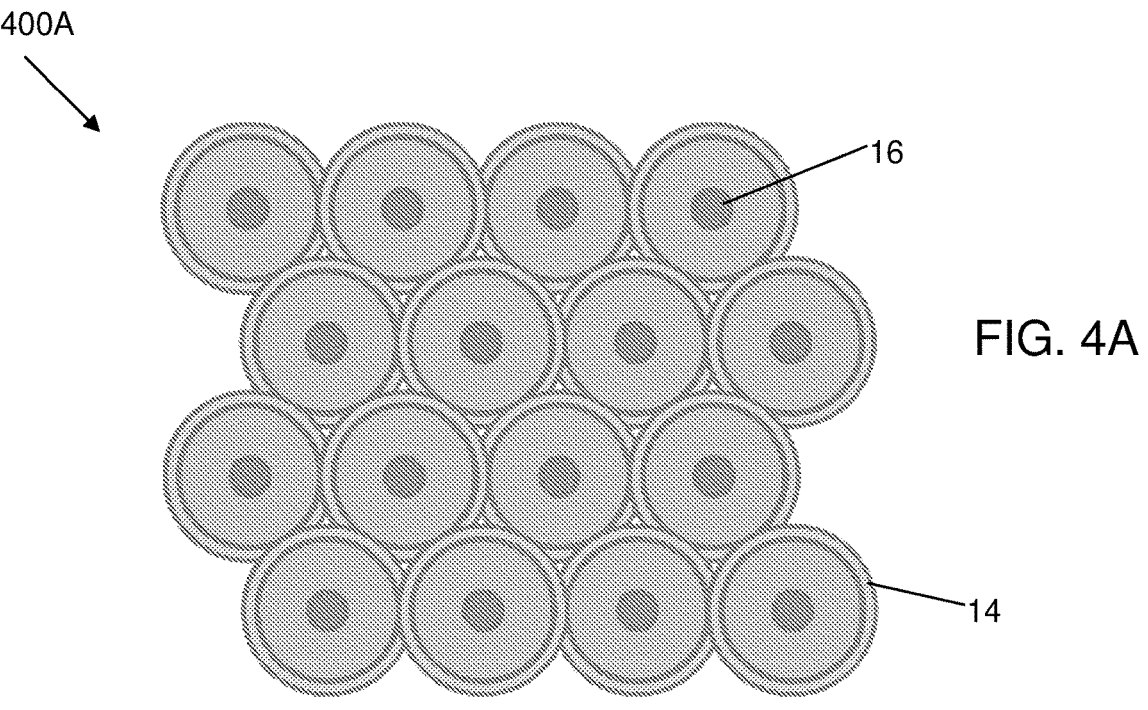
FIGS. 4A and 4B show a top view of different arrays of the SPADs in accordance with aspects of the present disclosure.
Figure 4B:
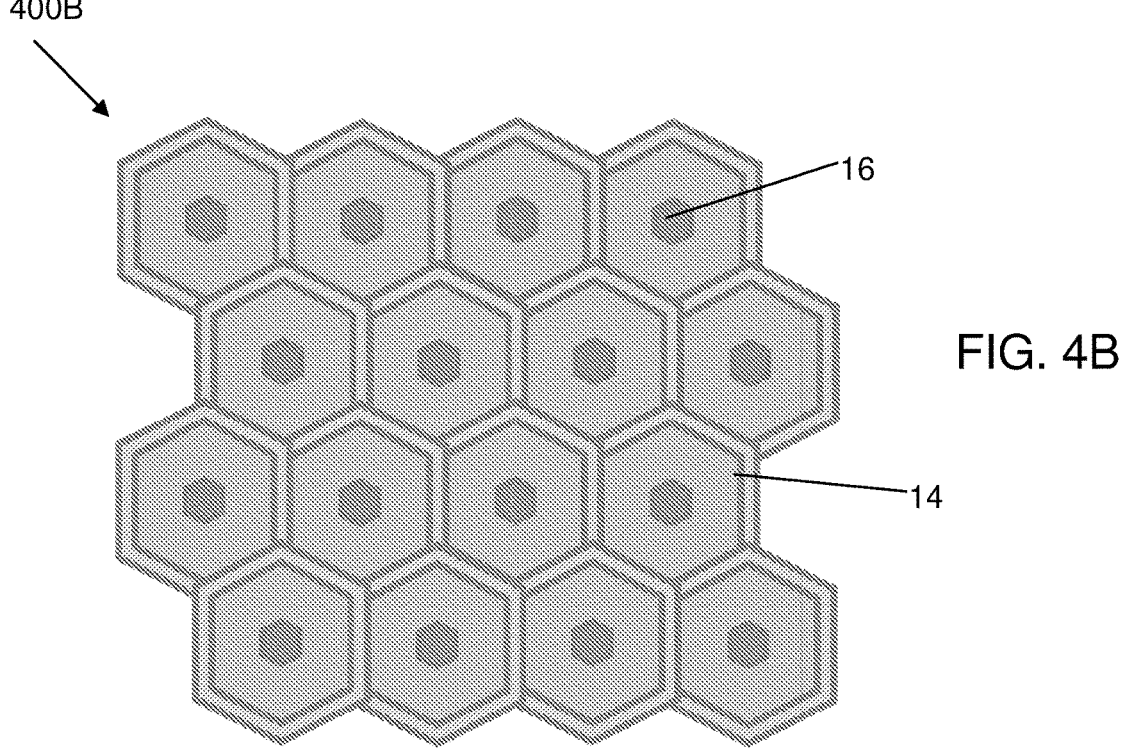

FIGS. 4A and 4B show a top view of different arrays of the SPADs in accordance with aspects of the present disclosure. For example, FIG. 4A shows an array 400A of cylindrical SPADs comprising the cathode 14 and anode 16;

whereas FIG. 4B shows an array 400B of hexagonal or honeycomb SPADs comprising the cathode 14 and anode 16. In both embodiments, the contact to the cathodes 14 may be shared, which significantly improves the fill factor. The fill factor is also further improved in the array 400B, which provides a complete or full coverage structure.

It should be understood by those of skill in the art that other shapes in the array are also contemplated herein, e.g., square, etc. Moreover, in any of the embodiments, the pixel size, e.g., cathode and anode spacing and diameter (of trench) can be shrunk to provide a compact structure and contribute to further scaling. For example, it is possible to enable sub-5 μm scaling (e.g., 8 μm diameter trench and an overall SPAD diameter of about 3 μm or 4 μm), which can improve fill-factor by greater than 5×.

In an exemplary non-limiting illustrative embodiment, the radius of the structure may be 1.8 μm with a doping level of the trenches, e.g., cathode 14 and anode 16, of $1E+21 \text{ cm}^{-3}$. In this example, boron can be used for the doping of the anode 16 and phosphorous can be used for the doping of the cathode 14. The structure can exhibit a breakdown voltage of 31.9V and provide a significant improvement of the fill factor (e.g., >5×) that allows for further miniaturization. The breakdown voltage can be further reduced by optimizing the doping levels or shrinking the size of the pixels, e.g., diameter of the cathode 14 and anode 16. Improvements in sensitivity compared to conventional SPAD structures can be achieved, e.g., 1.5×-2×, for a 7 μm structure with respect to a baseline wavelength of 940 nm. Further improvement can be expected by increasing the depth of the trenches or inserting optimized optical layers.

The SPADs can be utilized in system on chip (SoC) technology. The SoC is an integrated circuit (also known as a "chip") that integrates all components of an electronic system on a single chip or substrate. SoC is also used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:

a first deep trench structure in a semiconductor substrate comprising a conductive material and a material of a first polarity which is provided on a sidewall of the conductive material of the first deep trench structure;

a second deep trench structure in the semiconductor substrate surrounding the first deep trench structure, the second deep trench structure comprising a conductive material and a material of a second polarity which is provided on sidewalls of the conductive material of the second deep trench structure; and contacts to both the first deep trench structure and the second deep trench structure.

2. The structure of claim 1, wherein the first deep trench structure comprises an anode and the second deep trench structure comprises a cathode, the material of the first polarity surrounds the conductive material of the first deep trench structure and the material of the second polarity surrounds the conductive material of the second deep trench structure.

3. The structure of claim 1, wherein electric field lines are provided radially in a horizontal plane in an active area along a depth and between the first deep trench structure and the second deep trench structure.

4. The structure of claim 1, wherein the second deep trench structure completely surrounds the first deep trench structure, the first deep trench structure and the second deep trench structure are separated by the semiconductor substrate with the material of the first polarity facing the material of the second polarity.

5. The structure of claim 1, wherein the first deep trench structure and the second deep trench structure form a circular structure.

6. The structure of claim 1, wherein the first deep trench structure and the second deep trench structure form a polygonal shaped structure.

7. The structure of claim 1, wherein the first deep trench structure and the second deep trench structure extend to a backside of the semiconductor substrate.

8. The structure of claim 1, wherein the second deep trench structure extends to a backside of the semiconductor substrate and the first deep trench structure extends completely through the semiconductor substrate.

9. The structure of claim 2, wherein the material of the first polarity comprises N+ semiconductor material on sidewalls of the first deep trench structure and the material of the second polarity comprises P+ semiconductor material on the sidewalls of the second deep trench structure.

10. The structure of claim 2, wherein the material of the first polarity comprises P+ semiconductor material on sidewalls of the first deep trench structure and the material of the second polarity comprises N+ semiconductor material on the sidewalls of the second deep trench structure.

11. The structure of claim 10, wherein the conductive material comprises a non-transparent material.

12. The structure of claim 10, wherein the conductive material of the anode comprises polysilicon with the first polarity and the conductive material of the cathode comprises polysilicon with the second polarity.

13. A structure comprising:

a deep trench anode extending into a semiconductor substrate, the deep trench anode comprising a P+ doped sidewall on a sidewall of a conductive material;

a deep trench cathode surrounding the deep trench anode and extending into the semiconductor substrate, the deep trench cathode comprising an N+ doped sidewall on a sidewall of the conductive material, the P+ doped sidewall being a different polarity than the N+ doped sidewall; and a contact provided to both the deep trench anode and the deep trench cathode.

14. The structure of claim 13, wherein the deep trench cathode completely surrounds the deep trench anode, the P+ doped sidewall surrounds the conductive material of the deep trench anode and the N+ doped sidewall surrounds the conductive material of the deep trench cathode.

15. The structure of claim 13, wherein the deep trench cathode and the deep trench anode extend to a backside of the semiconductor substrate and the deep trench anode and the deep trench structure cathode are separated by the semiconductor substrate with the P+ doped sidewall facing the N+ doped sidewall.

16. The structure of claim 13, wherein the deep trench cathode extends to backside of the semiconductor substrate and the deep trench anode extends completely through the semiconductor substrate, and the contact to the deep trench cathode comprises the conductive material of the deep trench cathode.

17. The structure of claim 13, wherein the conductive material comprises non-transparent material.

18. The structure of claim 13, wherein the deep trench cathode, the deep trench anode and the semiconductor substrate comprise a P-i-N single-photon avalanche diode.

19. A method comprising:

forming a first deep trench structure in a semiconductor substrate comprising a conductive material and a material of a first polarity which is provided on a sidewall of the conductive material of the first deep trench structure;

forming a second deep trench structure in the semiconductor substrate surrounding the first deep trench structure, the second deep trench structure comprising a conductive material and a material of a second polarity, different than the first polarity, the material of the second polarity being on sidewalls of the conductive material of the second deep trench structure; and forming contacts to both the first deep trench structure and the second deep trench structure.

20. The method of claim 19, wherein the first deep trench and the second deep trench cause horizontal movement of charge with an electric field in a horizontal direction throughout a depth of the first deep trench and the second deep trench.

* * * * *